(12) United States Patent
Li et al.

(10) Patent No.: US 10,281,782 B2
(45) Date of Patent: May 7, 2019

(54) ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventors: Zhengliang Li, Beijing (CN); Shi Shu, Beijing (CN); Zhanfeng Cao, Beijing (CN); Bin Zhang, Beijing (CN); Xiaolong He, Beijing (CN); Qi Yao, Beijing (CN); Jincheng Gao, Beijing (CN); Feng Guan, Beijing (CN); Xuefei Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/229,601

(22) Filed: Aug. 5, 2016

(65) Prior Publication Data

US 2017/0192321 A1 Jul. 6, 2017

(30) Foreign Application Priority Data

Jan. 4, 2016 (CN) .......................... 2016 1 0004422

(51) Int. Cl.
*H01L 21/02* (2006.01)
*G02F 1/1362* (2006.01)
*H01L 27/12* (2006.01)

(52) U.S. Cl.
CPC .... *G02F 1/136209* (2013.01); *H01L 27/1218* (2013.01); *H01L 27/1222* (2013.01); *H01L 27/1259* (2013.01)

(58) Field of Classification Search
None
See application file for complete search history.

(56) References Cited

U.S. PATENT DOCUMENTS

| | | | | |
|---|---|---|---|---|
| 5,686,980 A * | 11/1997 | Hirayama | ......... | G02F 1/133512 257/294 |
| 8,610,124 B2 * | 12/2013 | Ro | .................... | G02F 1/136209 257/353 |

(Continued)

FOREIGN PATENT DOCUMENTS

| CN | 101630098 A | 1/2010 |
|---|---|---|
| CN | 103728797 A | 4/2014 |
| JP | S645129 A | 2/1989 |

OTHER PUBLICATIONS

Chinese Office Action dated Dec. 28, 2017.

*Primary Examiner* — Shamim Ahmed
(74) *Attorney, Agent, or Firm* — Dilworth & Barrese, LLP.; Michael J. Musella, Esq.

(57) ABSTRACT

A manufacturing method of an array substrate, an array substrate and a display device are provided. The method includes the following operations: forming a light shielding layer formed of a metal blacken production on a base substrate, wherein the metal blacken production is a product by blackening a metal; forming a preset film layer on the base substrate which is provided with the light shielding layer; forming both a pattern of the light shielding layer and a pattern of the preset film layer through one patterning process. The method of forming a pattern of the light shielding layer and a pattern of the preset film layer through one patterning process saves one patterning process.

6 Claims, 8 Drawing Sheets

(56) References Cited

U.S. PATENT DOCUMENTS

| | | | | |
|---|---|---|---|---|
| 9,318,629 | B2* | 4/2016 | Xu | H01L 23/481 |
| 2002/0158298 | A1* | 10/2002 | Yamada | H01L 27/12 |
| | | | | 257/471 |
| 2004/0263752 | A1* | 12/2004 | Kim | G02F 1/134363 |
| | | | | 349/141 |
| 2006/0138933 | A1* | 6/2006 | Yoo | H01J 29/085 |
| | | | | 313/495 |
| 2007/0090754 | A1* | 4/2007 | Li | H01L 51/5284 |
| | | | | 313/506 |
| 2012/0094409 | A1 | 4/2012 | Zhi et al. | |
| 2015/0009436 | A1* | 1/2015 | Kim | G02F 1/1334 |
| | | | | 349/33 |
| 2016/0020264 | A1* | 1/2016 | Choo | H01L 29/7869 |
| | | | | 257/40 |

* cited by examiner

ARRAY SUBSTRATE AND MANUFACTURING METHOD THEREOF, DISPLAY DEVICE

TECHNICAL FIELD

Embodiments of the present disclosure relate to a manufacturing method of an array substrate, an array substrate and a display device.

BACKGROUND

A display panel usually comprises an array substrate, a color filter substrate and a liquid crystal layer disposed between the array substrate and the color filter substrate. Patterning processes are needed in the process of manufacturing an array substrate and the production process is complex.

In an array substrate, in order to prevent light on the backlight side irradiating on the active layer therein and having an adverse impact on the active layer, a light shielding layer pattern is disposed between the active layer and the base substrate of the array substrate, and the light shielding layer pattern is usually made of a metal material such as molybdenum. The forming process of the array substrate is conducted as follows: forming a pattern of the light shielding layer on the base substrate through a patterning process firstly, and then forming a preset film layer (the preset film layer may include one of a buffer layer, an active layer or the like) on the base substrate which is provided with the light shielding layer through a plasma enhanced chemical vapor deposition (PECVD) process, and subsequently forming an active layer pattern on the active layer of the base substrate through a patterning process. The profile of the active layer pattern is consistent with the profile of the light shielding layer.

SUMMARY

In the first aspect, according to an embodiment of the present disclosure, a manufacturing method of an array substrate is provided, and the method includes: forming a light shielding layer formed of a metal blacken production on a base substrate, wherein the metal blacken production is a product by blackening a metal; forming a preset film layer on the base substrate which is provided with the light shielding layer; and forming both a pattern of the light shielding layer and a pattern of the preset film layer through one patterning process.

In the second aspect, according to an embodiment of the present disclosure, an array substrate is provided, and the array substrate includes: a base substrate; a pattern of a light shielding layer formed of a metal blacken production and disposed on the base substrate, the metal blacken production is a product by blackening a metal; a pattern of a preset film layer disposed on the pattern of the light shielding layer, the pattern of the preset film layer is consistent with the pattern of the light shielding layer in shape.

In the third aspect, according to an embodiment of the present disclosure, a display device is provided, and the display device includes the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure, and according to these drawings, those skilled in the art can obtain other drawing(s), without any inventive work.

FIG. 2-1 illustrates anther flow diagram of the manufacturing method of an array substrate provided by an embodiment of the present disclosure;

FIG. 2-2 and FIG. 2-3 are flow diagrams of forming a light shielding layer in the embodiment shown in FIG. 2-1;

FIG. 2-4 illustrates a flow diagram of a patterning process in the embodiment shown in FIG. 2-1;

FIG. 2-5 to FIG. 2-7 are schematic diagrams of the structure of an array substrate in the patterning process shown in FIG. 2-4;

FIG. 2-8 is a flow diagram of the following process in the embodiment shown in FIG. 2-1;

FIG. 2-9 to FIG. 2-15 are schematic diagrams of a structure of an array substrate in the flow diagram shown in FIG. 2-8;

FIG. 4-1 is a schematic diagram of the structure of an array substrate provided by an embodiment of the present disclosure; and FIG. 4-2 is another schematic diagram of the structure of an array substrate provided by an embodiment of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Series on the described embodiments herein, those skilled in the art can obtain other embodiment(s), without any inventive work, which should be within the scope of the disclosure.

In the process of the research, the inventors found: when forming a preset film layer structure through a PECVD process, a base substrate needs to be put into a PECVD equipment, and if a large area of metal layer is disposed on the base substrate, the PECVD equipment may be damaged, and therefore, the light shielding layer should be processed into a pattern of the light shielding layer through the patterning process firstly, and then a buffer layer and an active layer are formed on the array substrate through the PECVD process. Thus, one patterning process is added, the producing process become more complicated, and the cost is increased.

Figure 1:
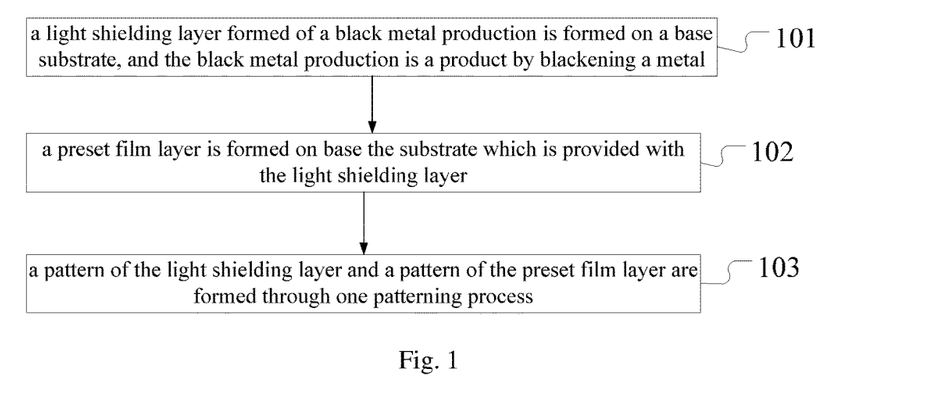
FIG. 1 illustrates a flow diagram of the manufacturing method of an array substrate provided by an embodiment of the present disclosure.

FIG. 1 is a flow diagram of a manufacturing method of an array substrate provided by an embodiment of the present disclosure, and the embodiment is illustrated by applying the method to the manufacture of an array substrate. The manufacturing method of the array substrate comprises the following operations:

In step 101, a light shielding layer formed of a metal blacken production is formed on a base substrate, and the metal blacken production is a product by blackening a metal.

In step 102, a preset film layer is formed on the base substrate which is provided with the light shielding layer.

In step 103, a pattern of the light shielding layer and a pattern of the preset film layer are formed through a patterning process.

In summary, in the manufacturing method of an array substrate provided by the embodiment of the present disclosure, a light shielding layer is formed by using a metal blacken production, and the conductive performance of the metal blacken production is poor, so a preset film layer can be formed on the base substrate which is provided with the light shielding layer, and then both the pattern of the light shielding layer and the pattern of the preset film layer are formed through a single patterning process. Compared to the processes of processing the light shielding layer into a pattern of the light shielding layer through the patterning process firstly and then forming the buffer layer and the active layer on the array substrate, in the embodiment of the present disclosure one patterning process is reduced, and the problems of complex fabrication process and high cost for an array substrate can be solved, so the effects of simpler production process and reduced cost are achieved in the manufacturing process of the array substrate. At the same time, the light shielding property of the light shielding layer is improved, and the performance of the array substrate is improved.

Figure 21:
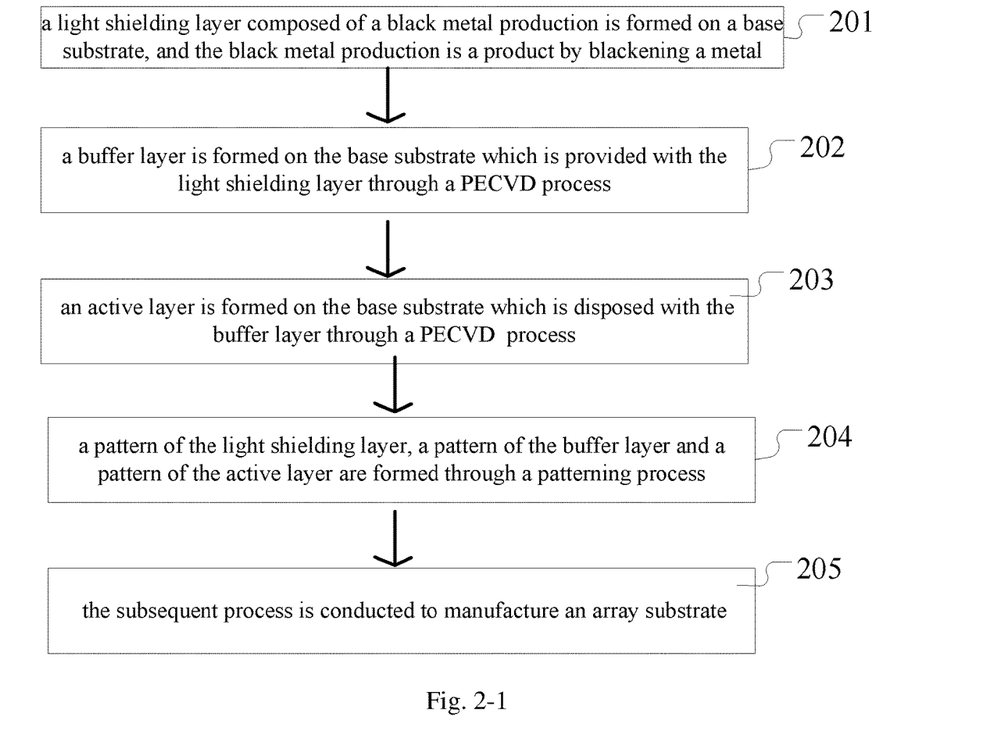

FIG. 2-1 is anther flow diagram of the manufacturing method of an array substrate provided by an embodiment of the present disclosure, and the embodiment is illustrated by applying the method to the manufacture of an array substrate. The manufacturing method of the array substrate comprises the following operations:

In step 201, a light shielding layer formed of a metal blacken production is formed on a base substrate, and the metal blacken production is a product by blackening a metal.

In the manufacturing method of an array substrate provided by the embodiment of the present disclosure, a light shielding layer is formed by using a metal blacken production firstly, and the metal blacken production is a product by blackening a metal.

According to the different formation ways, this step may include the following two cases.

Figure 22:
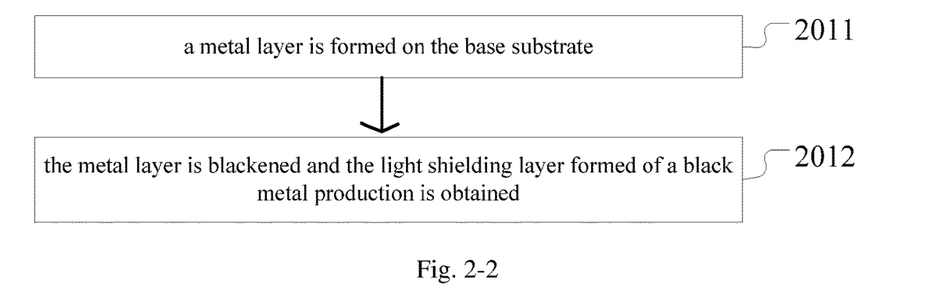

The first case can be conducted as shown in FIG. 2-2.

In sub-step 2011, a metal layer is formed on the base substrate.

In this case, a metal layer can be formed on the base substrate, and the metal layer can be a molybdenum metal layer, a copper metal layer, a molybdenum alloy metal layer or a copper alloy metal layer etc. For example, the metal layer can be formed by sputtering or evaporation.

In sub-step 2012, the metal layer is blackened and the light shielding layer formed of a metal blacken production is obtained.

After the metal layer is formed on the array substrate, the metal layer can be blackened and the light shielding layer formed of a metal blacken production is obtained. When blackening the metal layer, according to the different metal layers, the methods of blackening may also be different. For example, in the case of the metal layer is a molybdenum metal layer, oxygen gas can be passed onto the surface of the base substrate to blacken the molybdenum metal layer.

Figure 23:
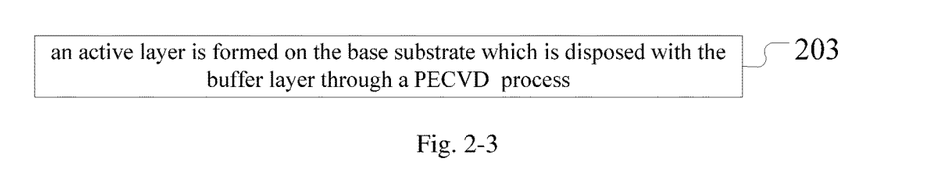

The second case is conducted as shown in FIG. 2-3.

In sub-step 2013, the light shielding layer is formed on the base substrate by using a pre-filming material formed of a metal blacken production.

In this case, the light shielding layer is formed on the base substrate by using a pre-filming material formed of a metal blacken production. That is, the pre-filming material formed of the metal blacken production is obtained firstly, and then the light shielding layer is formed on the base substrate by using a pre-filming material. For example, the light shielding layer can be formed by sputtering or evaporation.

It should be noted that, the metal blacken production involved in the present embodiment comprises at least one selected from the group consisting of a molybdenum oxide, a molybdenum nitride, a molybdenum oxynitride, a copper oxide, a copper nitride and a copper oxynitride. For example, MoO (molybdenum oxide), MoN (molybdenum nitride), MoON (molybdenum oxynitride), CuO (copper oxide), CuN (copper nitride), or CuON (copper oxynitride) can be used.

The metal blacken production involved in the present embodiment may further comprise at least one selected from the group consisting of a molybdenum alloy oxide, a molybdenum alloy nitride, a molybdenum alloy oxynitride, a copper alloy oxide, a copper alloy nitride and a copper alloy oxynitride. The molybdenum alloy as well as the copper alloy may be an alloy include Ca (calcium), Mg (magnesium), Al (aluminum), Sr (strontium), Ba (barium), Ra (radium) and Nb (niobium), Nd (neodymium), Ta (tantalum) and Hf (hafnium), Y (yttrium), Cr (chromium), W (tungsten), Mn (manganese), Ni (nickel), Pt (Platinum), Ag (silver), Zn (zinc) or Sn (tin), for example, CuMgAl, CuMo, CuMn, MoNb, MoTa etc., and the black alloy product may include: CuCaO, CuCaN, CuCaON or the like.

It should be noted that, the metal blacken production not only has poor electrical conductivity property but also possesses reflectivity (the smaller the reflectivity the deeper the color and the higher the shielding performance) lower than the metal light shielding layer. For example, the reflectivity of Mo metal layer is 50%, while the reflectivity of molybdenum oxide layer is less than 10%. That is the light shielding layer is made of the metal blacken production in the embodiment of the present disclosure, and the shielding performance of the light shielding layer is improved.

It also should be noted that, the manufacturing method of an array substrate provided by an embodiment of the present disclosure, for example, can be used for the manufacture of an H-ADS (high aperture ratio advanced super dimension switch) NMOS (N type metal oxide semiconductor) TFT-LCD (thin film transistor display) and the like.

In step 202, a buffer layer is formed on the base substrate which is provided with the light shielding layer through a plasma enhanced chemical vapor deposition (PECVD) process.

Firstly, the buffer layer is formed on the base substrate which is provided with the light shielding layer through a plasma enhanced chemical vapor deposition (PECVD) process. For example, the buffer layer can be in a single layer structure but also can be in a multi-layer structure. For example, the buffer layer may comprise a first buffer layer and a second buffer layer formed in order, and the first buffer layer can be formed of SiNx (silicon nitride), and the second buffer layer can be formed by SiOx (silicon oxide).

It should be noted that, because the light shielding layer is formed of the metal blacken production with low conductive performance, when the base substrate disposed with the light shielding layer is put into the PECVD equipment to form a buffer layer by the PECVD process, the PECVD equipment will not be damaged.

In step 203, an active layer is formed on the base substrate which is disposed with a buffer layer through a plasma enhanced chemical vapor deposition (PECVD) process.

After the buffer layer is formed, an active layer can be formed on the base substrate which is disposed with a buffer layer through the PECVD process.

For example, an amorphous silicon (a-Si) is formed on the base substrate which is disposed with a buffer layer through a PECVD process firstly, then the amorphous silicon is converted into a polycrystalline silicon (p-Si) through a laser annealing process, and then the fabrication of the active layer is completed. The active layer can also be made of another appropriate material such as microcrystalline silicon, polycrystalline silicon, oxide semiconductor (e.g. IGZO), and the like.

In step 204, a pattern of the light shielding layer, a pattern of the buffer layer and a pattern of the active layer are formed through one patterning process.

After a preset film is formed on the base substrate, a pattern of the light shielding layer, a pattern of the buffer layer and a pattern of the active layer can be formed together through one patterning process. This step may be the first patterning process. For example, a patterning process includes forming a photoresist layer on a layer to be etched, using a mask plate to expose the photoresist layer; developing the exposed photoresist layer to obtain a photoresist pattern, etching the layer to be etched by using the photoresist pattern as an etching mask, and removing the photoresist pattern. In this situation, one mask plate is used in one patterning process.

Figure 24:
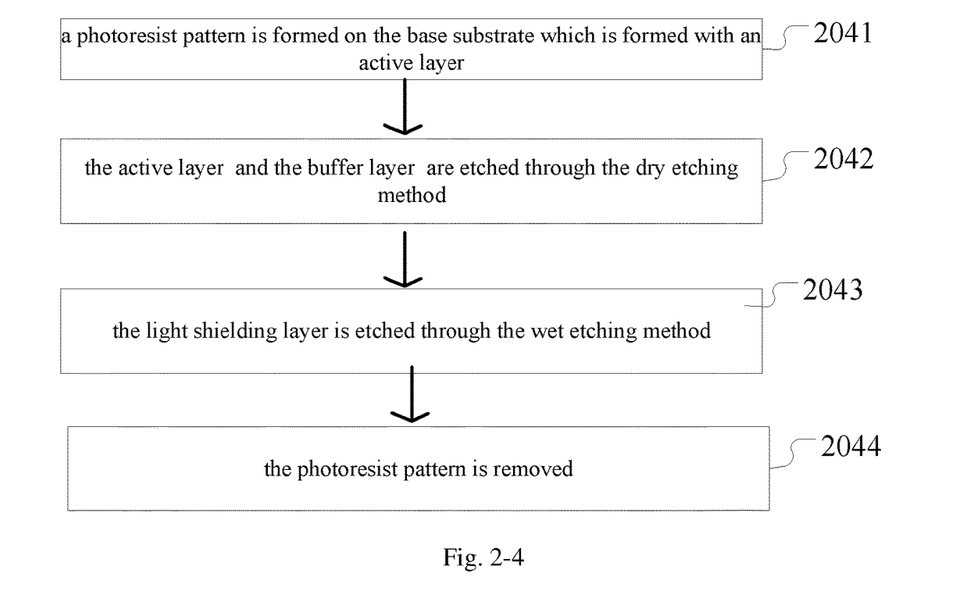

As shown in FIG. 2-4, the step 204 includes the following sub-steps.

In sub-step 2041, a photoresist pattern is formed on the base substrate which is formed with an active layer.

Figure 25:
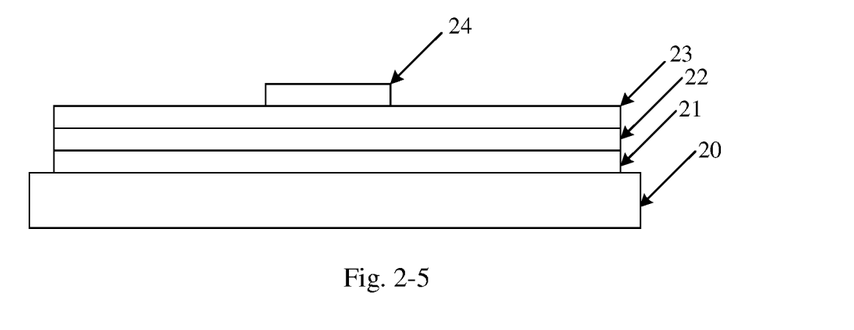

First, a photoresist pattern can be formed on the base substrate which is formed with an active layer, and the shape of the photoresist pattern is the same as that of the light shielding layer to be formed. At the end of the step, the structure of the base substrate is shown in FIG. 2-5, and includes the base substrate 20, the light shielding layer 21, the buffer layer 22, the active layer 23, and the photoresist pattern 24.

In sub-step 2042, the active layer 23 and the buffer layer 22 are etched through a dry etching method.

Figure 26:
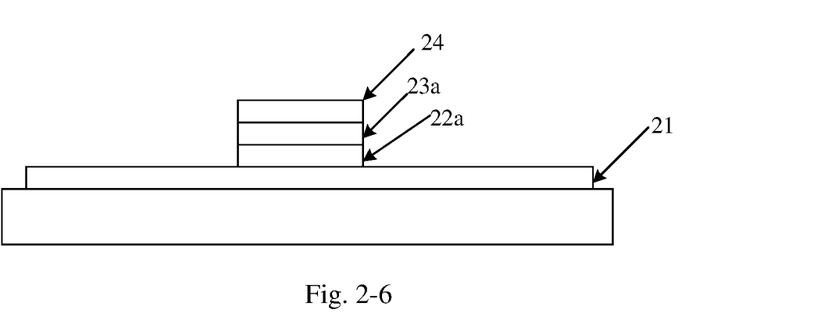

After the photoresist pattern is formed, the active layer 23 and the buffer layer 22 can be etched through the dry etching method to obtain the patterns of the active layer and the buffer layer. At the end of the step, the structure of the base substrate is shown in FIG. 2-6, and includes the light shielding layer 21, the pattern of the buffer layer 22*a*, the pattern of the active layer 23*a*, and the photoresist pattern 24.

In sub-step 2043, the light shielding layer is etched through a wet etching method.

Figure 27:
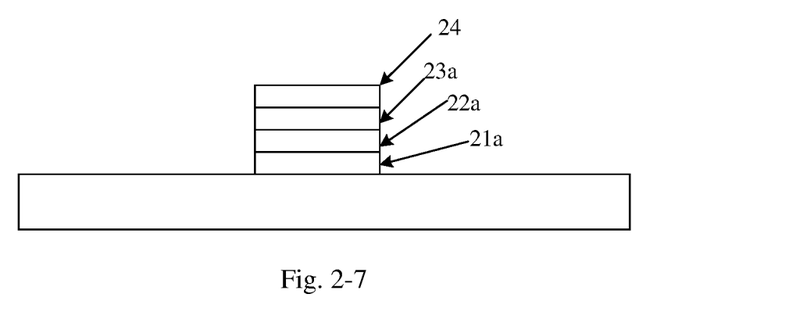

After the active layer and the buffer layer are etched, the light shielding layer can be etched through the wet etching method to obtain the pattern of the light shielding layer. At the end of the step, the structure of the base substrate can be shown in FIG. 2-7, and includes the pattern of the light shielding layer 21a, the pattern of the buffer layer 22*a*, the pattern of the active layer 23*a*, and the photoresist pattern 24.

In sub-step 2044, the photoresist pattern is stripped.

At last, the photoresist on the base substrate is removed to finish the patterning process.

Compared to the method which needs two patterning processes to form the patterns of the active layer and the light shielding layer on the base substrate, the manufacturing method of the array substrate provided by the embodiment of the present disclosure uses only one patterning process to form the patterns of the active layer and the light shielding layer.

It should be noted that, in the embodiment of the present disclosure, the shapes of all the patterns formed through one patterning process can be the same.

In step 205, the subsequent process is conducted to conclude the manufacture of the array substrate.

Figure 28:
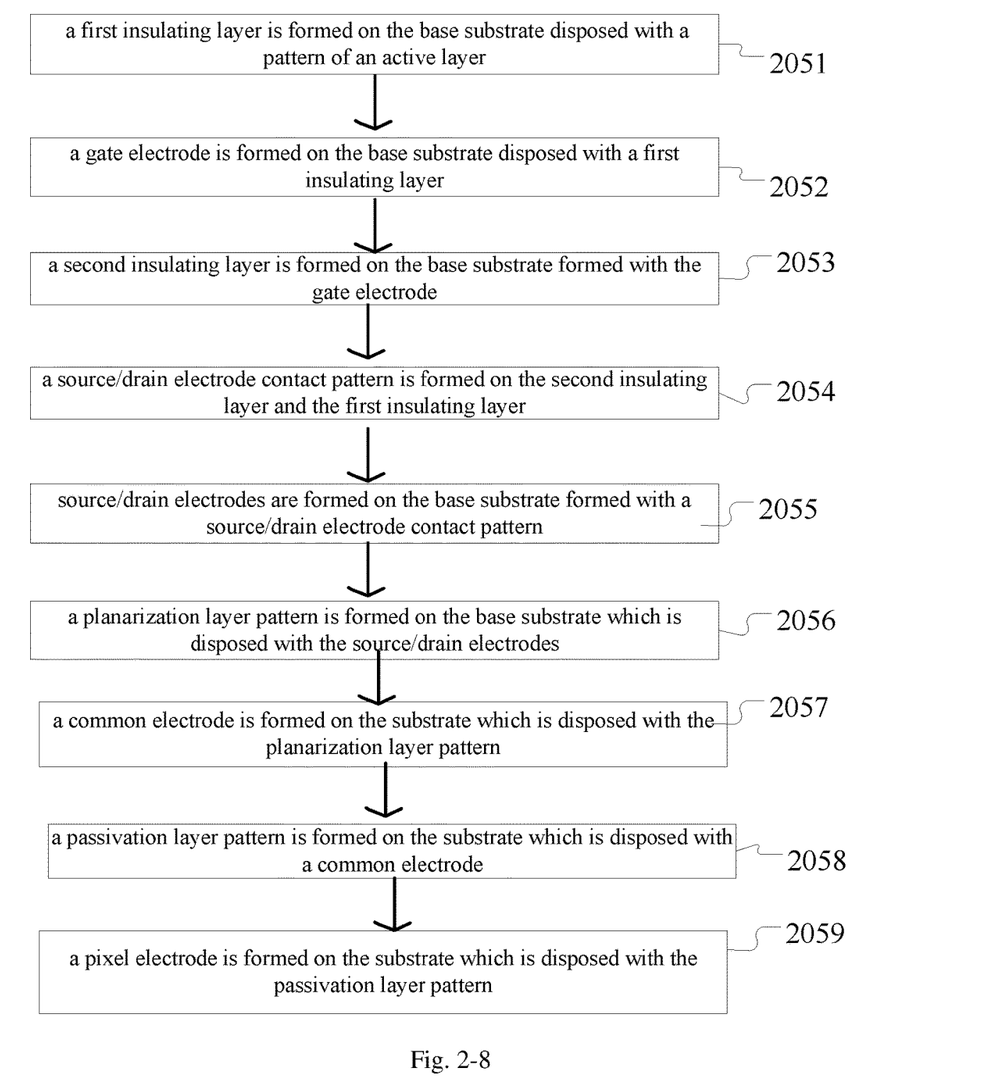

After the patterns of the light shielding layer, the buffer layer, and the active layer are formed on the base substrate, the subsequent process is conducted to conclude the manufacture of the array substrate. For example, as shown in FIG. 2-8, the subsequent process includes the following operations:

In sub-step 2051, a first insulating layer is formed on the base substrate disposed with the pattern of the active layer.

In sub-step 2052, a gate electrode is formed on the base substrate disposed with the first insulating layer.

Figure 29:
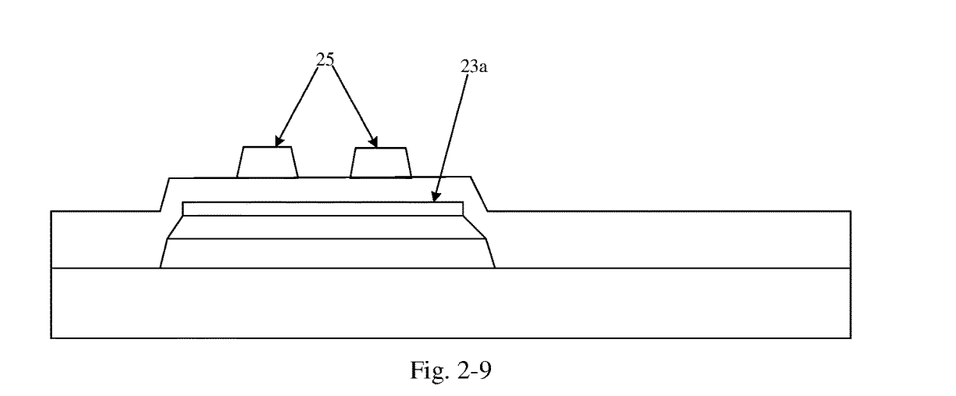

At the end of the step, the structure of the base substrate can be shown in FIG. 2-9, includes the pattern of the gate electrode 25 and the pattern of the active layer 23*a*. The situation showed in FIG. 2-9 involves the structure of double gate electrodes, and other situations involving a single gate electrode can formed in a similar way, and detailed descriptions will be omitted herein.

This step is the second patterning process.

It should be noted that, the method for manufacturing an array substrate provided by the embodiment of the present disclosure can be applied to form a thin film transistor (TFT) of top gate type. In addition, the method in the embodiment of the present disclosure can also be applied to other devices which need a pattern of a light shielding layer.

In sub-step 2053, a second insulating layer is formed on a base substrate formed with the gate electrode.

In sub-step 2054, a source/drain electrode contact pattern is formed on the second insulating layer and the first insulating layer.

The source/drain electrode contact pattern contains a source/drain electrode contact via hole, which is used to make the source/drain electrode contact with the active layer.

Figure 210:
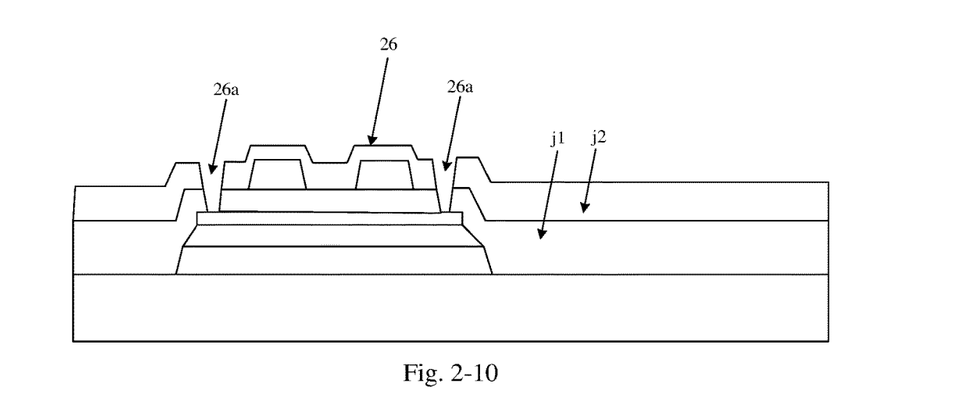

At the end of the step, the structure of the base substrate can be shown in FIG. 2-10, and includes a source/drain electrode contact pattern 26, a source/drain electrode contact via hole 26*a*, a first insulating layer j1, and a second insulating layer j2.

This step is the third patterning process.

In sub-step 2055, source/drain electrodes are formed on the base substrate formed with the source/drain electrode contact pattern.

Figure 211:
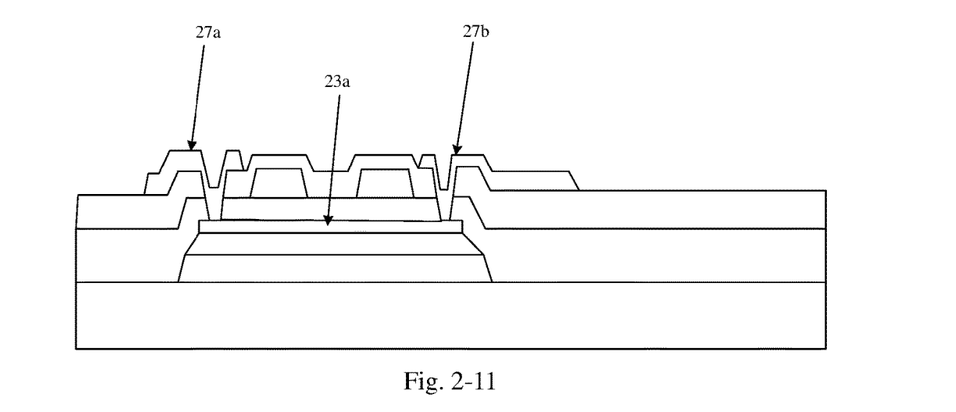

At the end of the step, the structure of the base substrate can be shown in FIG. 2-11, and includes a source electrode 27*a* and a drain electrode 27*b*, and the source electrode 27*a* and the drain electrode 27*b* are in contact with the active layer pattern 23*a*.

This step is the fourth patterning process.

In sub-step 2056, a planarization layer pattern is formed on the base substrate which is disposed with the source/drain electrodes.

Figure 212:
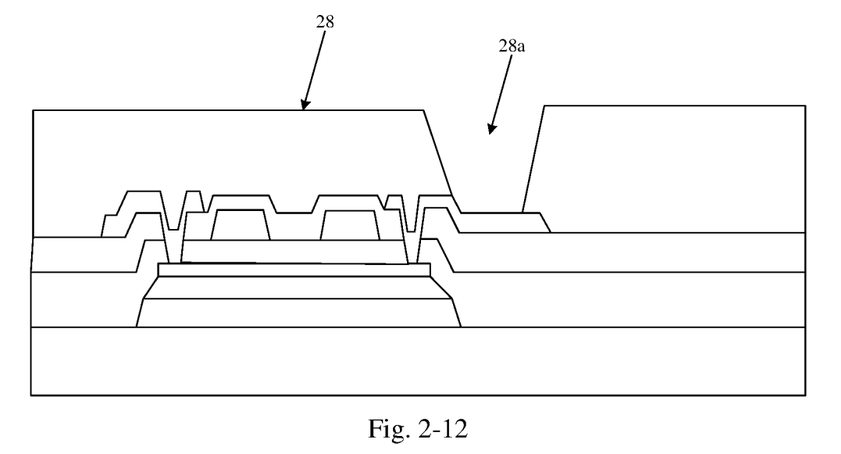

At the end of the step, the structure of the base substrate can be shown in FIG. 2-12, and includes a planarization layer pattern 28, and a drain electrode contact via hole 28*a* can be arranged in the planarization layer pattern 28. The planarization layer pattern 28 can be made of a resin.

This step is the fifth patterning process.

In sub-step 2057, a common electrode is formed on the base substrate which is disposed with the planarization layer pattern.

Figure 213:
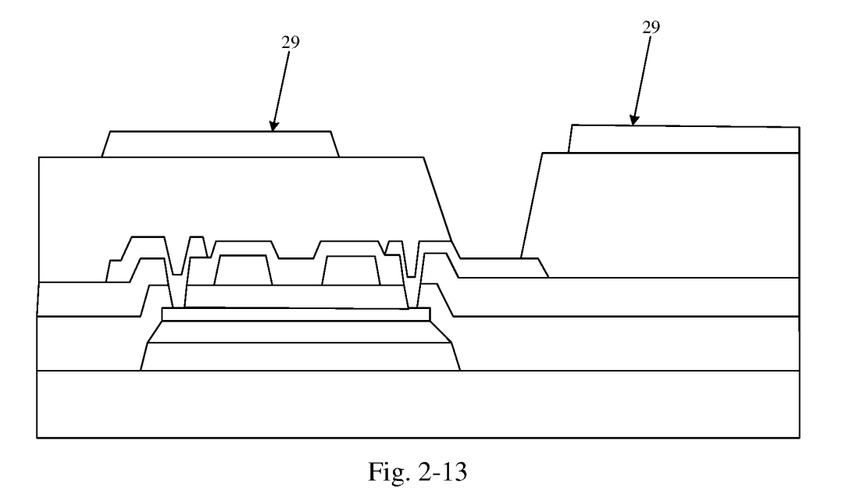

At the end of the step, the structure of the base substrate can be shown in FIG. 2-13, and include the common electrode 29. The common electrode can be made of IZO (indium zinc oxide), ITO (indium tin oxide), IGZO (Indium Gallium Zinc Oxide), ITZO (Indium tin zinc oxide), TZO (titanium doped Zinc Oxide), GZO (Gallium Zinc Oxide) or IGO (indium gallium oxide).

This step is the sixth patterning process.

In sub-step 2058, a passivation layer pattern is formed on the base substrate which is disposed with the common electrode.

Figure 214:
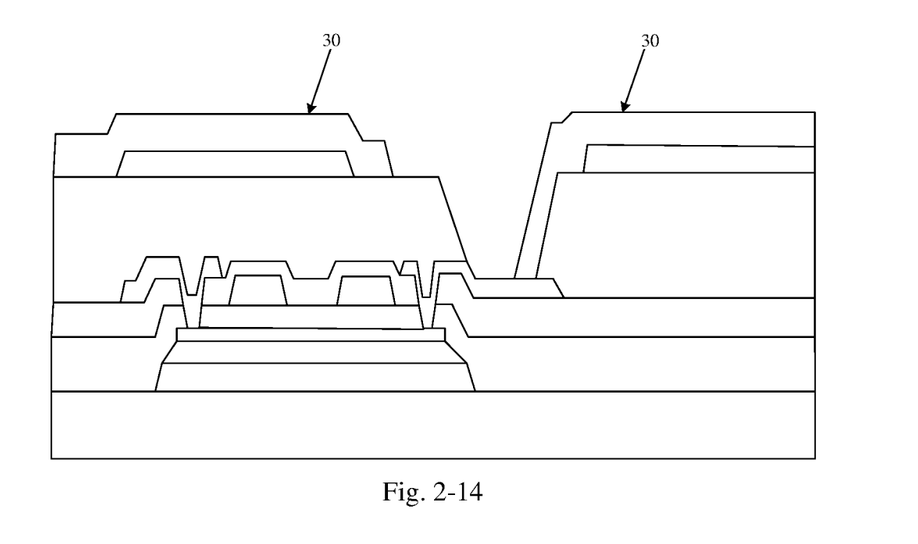

At the end of the step, the structure of the base substrate can be shown in FIG. 2-14, and include a passivation layer pattern.

This step is the seventh patterning process.

In sub-step 2059, a pixel electrode is formed on the base substrate which is disposed with the passivation layer pattern.

Figure 215:
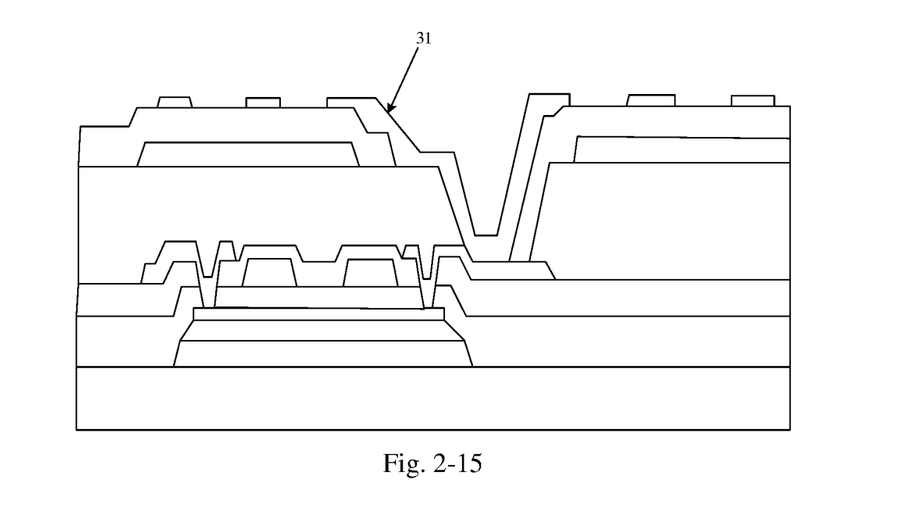

At the end of the step, the structure of the base substrate can be shown in FIG. 2-15, and includes a pixel electrode 31. The pixel electrode 31 can be made of IZO, ITO, IGZO, ITZO, TZO, GZO or IGO.

This step is the eighth patterning process. Here, the fabrication of the array substrate is completed and eight patterning processes are used in total.

What need to be explained additionally is that the manufacturing method of the array substrate provided by the embodiment of the present disclosure forms a buffer layer and an active layer directly on the light shielding layer by using a PECVD process, and one patterning process is reduced, and the cost and time for manufacturing the array substrate is decreased.

What need to be explained additional is that the manufacturing method of the array substrate provided by the embodiment of the present disclosure uses the metal blacken production to form the light shielding layer, thus the effect of improving the light shielding performance of the light shielding layer is achieved.

In summary, in the manufacturing method of the array substrate provided by the embodiment of the present disclosure, a light shielding layer is formed by using a metal blacken production, and the conductive performance of the metal blacken production is poor. Thus, a preset film layer can continue to be formed on the base substrate disposed with the light shielding layer, and then the patterns of the light shielding layer and the preset film are formed through one patterning process. The technical method in the embodiment of the present disclosure saves one patterning process, and solves the problem of the complicated manufacturing process and high cost for an array substrate, and achieves the effect that the manufacturing process of the array substrate becomes relatively simple, and the cost is saved. At the same time, the shielding performance of the light shielding layer is improved, and the performance of the array substrate is improved.

Figure 3:
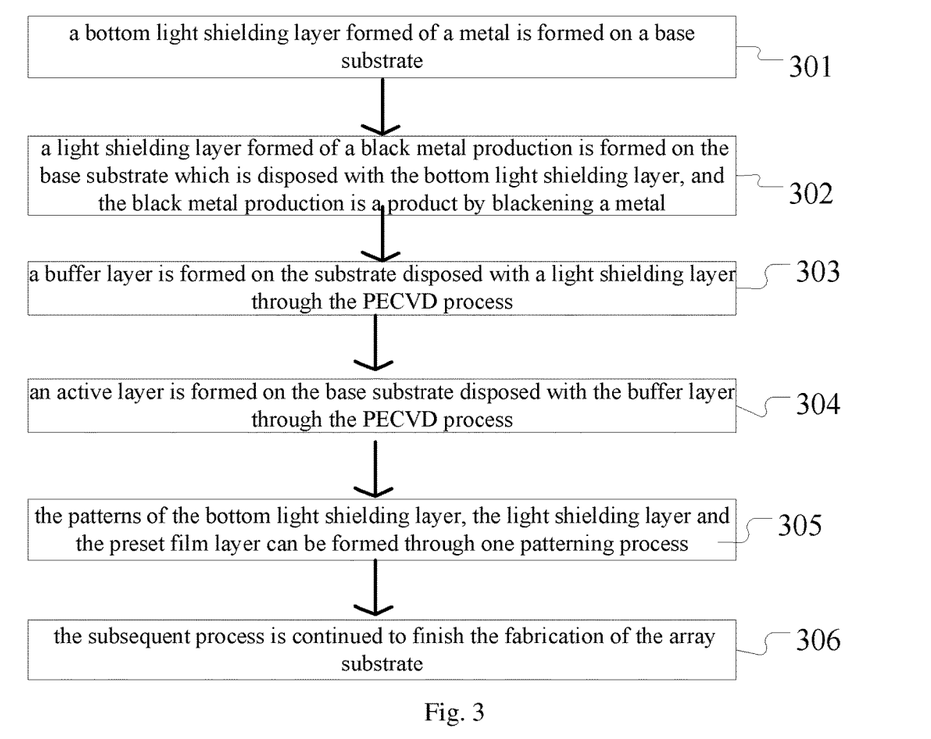
FIG. 3 is anther flow diagram of the manufacturing method of an array substrate provided by an embodiment of the present disclosure.

FIG. 3 is anther flow diagram of the manufacturing method of an array substrate provided by an embodiment of the present disclosure, and the embodiment is illustrated by applying the method to the manufacture of an array substrate. The manufacturing method of the array substrate comprises the following operations:

In step 301, a bottom light shielding layer formed of a metal is formed on a base substrate.

When using the manufacturing method of an array substrate provided by the embodiment of the present disclosure, a bottom light shielding layer formed of a metal can be formed on a base substrate firstly. The bottom light shielding layer can be a molybdenum metal layer or a copper metal layer, etc.

In step 302, a light shielding layer formed of a metal blacken production is formed on the base substrate which is disposed with the bottom light shielding layer, and the metal blacken production is a product by blackening the metal.

After the bottom light shielding layer is formed on the base substrate, a light shielding layer formed of a metal blacken production can be formed on the base substrate which is disposed with the bottom light shielding layer and the metal blacken production is a product by blackening the metal. The forming process of the blacked metal material can refer to the step 201 in the embodiment as shown in FIG. 2-1. The process to blacken for example the surface of the bottom light shielding layer formed of metal includes an oxidization treatment, nitriding treatment, oxynitriding treatment or the like according to the type of the metal blacken production to be formed, for example, metal oxide, metal nitride, metal oxynitride or the like.

In step 303, a buffer layer is formed on the base substrate disposed with the light shielding layer through the PECVD process.

After forming the light shielding layer formed of the metal blacken production on the bottom light shielding layer, because the light shielding layer covers the bottom light shielding layer, a buffer layer can be formed on the base substrate disposed with the light shielding layer through the PECVD process. The buffer layer can be in a single layer structure, but also can be in a multi-layer structure. For example, the buffer layer may comprise a first buffer layer and a second buffer layer formed in or, and the first buffer layer can be formed of SiNx (silicon nitride), and the second buffer layer can be formed by SiOx (silicon oxide).

The step can refer to the step 201 in the embodiment shown in FIG. 2-1.

In step 304, an active layer is formed on the base substrate disposed with the buffer layer through a PECVD process.

After the buffer layer is formed, an active layer can be formed on the base substrate disposed with the buffer layer through the PECVD process.

For example, amorphous silicon (a-Si) can be formed on the base substrate disposed with the buffer layer through the PECVD process firstly, and then the amorphous silicon is converted into polycrystalline silicon (p-Si) through a laser annealing process to complete the manufacturing process of the active layer.

In step 305, the patterns of the bottom light shielding layer, the light shielding layer and the preset film layer can be formed through one patterning process.

After a preset film is formed on the base substrate, the patterns of the bottom light shielding layer, the light shielding layer and the preset film layer can be formed through a single patterning process. The step can refer to the step 204 in the embodiment shown in FIG. 2-1. Different from step 204, this step requires to additionally etch the bottom light shielding layer, and the bottom light shielding layer and the light shielding layer are etched together.

In step 306, the subsequent process is continued to finish the fabrication of the array substrate.

After the patterns of the bottom light shielding layer, the light shielding layer, the buffer layer, and the active layer formed on the base substrate, the subsequent process can be used to manufacture an array substrate. The step can refer to the step 205 in the embodiment as shown in FIG. 2-1.

What need to be explained additionally is that the manufacturing method of the array substrate provided by the embodiment of the present disclosure uses the metal blacken production on the bottom light shielding layer to form the light shielding layer, and the light shielding performance of the light shielding layer is improved.

In summary, in the manufacturing method of the array substrate provided by the embodiment of the present disclosure a light shielding layer is formed by using a metal blacken production, and the conductive performance of the metal blacken production is poor. Thus, a preset film layer can continue to be formed on the base substrate disposed with a light shielding layer, and then the patterns of the light shielding layer and the preset film are formed through one patterning process. The technical method in the embodiment of the present disclosure saves one patterning process, and solves the problem of the complicated manufacturing process and high cost for the array substrate, and achieves the effect that the manufacturing process of the array substrate becomes relatively simple, and the cost is saved. At the same time, the shielding performance of the light shielding layer is improved, and the performance of the array substrate is improved.

Figure 41:
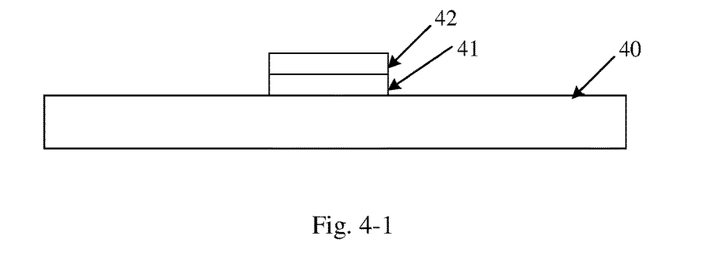

FIG. 4-1 is a schematic diagram of the structure of an array substrate provided by an embodiment of the present disclosure, and the array substrate comprises: a base substrate 40, a pattern of a light shielding layer 41 formed of a metal blacken production and disposed on the base substrate. The metal blacken production is a product by blackening a metal.

A pattern of a preset film layer 42 is disposed on the pattern of the light shielding layer 41, and the pattern of the preset film layer is consistent with the pattern of the light shielding layer in shape.

Figure 42:
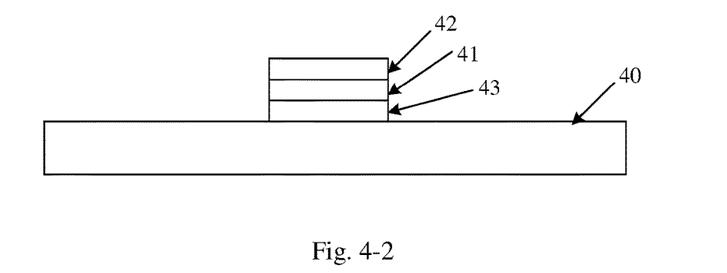

Optionally, as shown in FIG. 4-2, a pattern of the bottom light shielding layer 43 is formed between the pattern of the light shielding layer 41 and the base substrate 40, the pattern of the bottom light shielding layer 43 is consistent with the pattern of the light shielding layer 41 in shape.

What need to be explained additionally is that the array substrate provided by the embodiment of the present disclosure uses the metal blacken production to form the light shielding layer on the bottom light shielding layer, and the light shielding performance of the light shielding layer is improved.

In summary, the array substrate provided by the embodiment of the present disclosure uses a metal blacken production to form a light shielding layer, and the conductive performance of the metal blacken production is poor. Thus, a preset film layer can continue to be formed on the base substrate disposed with the light shielding layer, and then the patterns of the light shielding layer and the preset film are formed through one patterning process. The technical method in the embodiment of the present disclosure saves one patterning process step, and solves the problem of the complicated manufacturing process and high cost for the array substrate, and achieves the effect that the manufacturing process of the array substrate is relatively simple, and the cost is saved. Furthermore, the shielding performance of the light shielding layer is improved, and the performance of the array substrate is improved.

In addition, the embodiment of the present disclosure also provides a display device, and the display device comprises the array substrate shown in FIG. 4-1, or the array substrate shown in FIG. 4-2.

The present application claims the priority of the Chinese Patent Application No. 201610004422.5 filed on Jan. 4, 2016, which is entirely incorporated herein by reference as part of the disclosure of the present application.

What is claimed is:

1. A manufacturing method of an array substrate, comprising:
    forming a bottom light shielding layer formed of a metal on a base substrate;
    forming a light shielding layer formed of a metal blacken production on the bottom light shielding layer, wherein the metal blacken production is a product by blackening a metal;
    forming a preset film layer on the base substrate which is provided with the bottom light shielding layer and the light shielding layer; and
    forming a pattern of the bottom light shielding layer, a pattern of the light shielding layer and a pattern of the preset film layer through one patterning process using one mask plate,
    wherein the forming the light shielding layer formed of the metal blacken production on the bottom light shielding layer comprises:
        forming a metal layer on the bottom light shielding layer; and
        blackening the metal layer and obtaining the light shielding layer formed of the metal blacken production.

2. The manufacturing method according to claim 1, wherein forming the preset film layer on the base substrate provided with the light shielding layer comprises:
    forming the preset film layer on the base substrate which is provided with the light shielding layer through a plasma enhanced chemical vapor deposition (PECVD) process.

3. The manufacturing method according to claim 2, wherein the preset film layer comprises a buffer layer and an active layer.

4. The manufacturing method according to claim 1, wherein forming the light shielding layer formed of the metal blacken production on the base substrate comprises:
    forming the light shielding layer on the base substrate by using a pre-filming material formed of the metal blacken production.

5. The manufacturing method according to claim 1, wherein the metal blacken production comprises at least one selected from the group consisting of a molybdenum oxide, a molybdenum nitride, a molybdenum oxynitride, a copper oxide, a copper nitride and a copper oxynitride.

6. The manufacturing method according to claim 1, wherein the metal blacken production comprises at least one selected from the group consisting of a molybdenum alloy oxide, a molybdenum alloy nitride, a molybdenum alloy oxynitride, a copper alloy oxide, a copper series alloy nitride, and a copper alloy oxynitride.

* * * * *